United States Patent
Ueno

(10) Patent No.: US 7,394,325 B2
(45) Date of Patent: Jul. 1, 2008

(54) VOLTAGE-CONTROLLED OSCILLATOR CIRCUIT AND PLL CIRCUIT

(75) Inventor: Yosuke Ueno, Kanagawa (JP)

(73) Assignee: Sony Corporation (JP)

( * ) Notice: Subject to any disclaimer, the term of this patent is extended or adjusted under 35 U.S.C. 154(b) by 30 days.

(21) Appl. No.: 11/482,028

(22) Filed: Jul. 7, 2006

(65) Prior Publication Data

US 2007/0018738 A1 Jan. 25, 2007

(30) Foreign Application Priority Data

Jul. 12, 2005 (JP) ............................. P2005-202913

(51) Int. Cl.
*H03K 3/03* (2006.01)
(52) U.S. Cl. ......................................................... 331/57
(58) Field of Classification Search .................. 331/45, 331/57, 108 R, 108 C, 175, 177 R, 185
See application file for complete search history.

(56) References Cited

U.S. PATENT DOCUMENTS 6,650,191 B2 * 11/2003 Branch et al. .................. 331/57

6,653,908 B1 * 11/2003 Jones ........................... 331/183
2002/0049936 A1 * 4/2002 Gutnik et al. ................ 714/700

FOREIGN PATENT DOCUMENTS

JP 09214299 A * 8/1997
JP 2001-326560 A 11/2001

OTHER PUBLICATIONS

Ali Hajimiri, et al., "General Theory of Phase Noise in Electrical Oscillators,", IEEE Journal of Solid-State Circuits, vol. 33, No. 2, Feb. 1998.

* cited by examiner

*Primary Examiner*—Robert J. Pascal
*Assistant Examiner*—Ryan J Johnson
(74) *Attorney, Agent, or Firm*—Rader Fishman & Grauer PLLC; Ronald P. Kananen

(57) ABSTRACT

A differential type voltage-controlled oscillator circuit including: a plurality of VCO cells each having one pair of switching elements, the switching elements having one terminal side connected to a voltage source via a load and another terminal side connected to a common current source via a common node, the switching elements being supplied with differential signals, the plurality of VCO cells outputting differential signals different in phase from the differential signals; and a vibration canceling section connecting the plurality of VCO cells such that vibration at each node is cancelled.

8 Claims, 12 Drawing Sheets

FIG.3
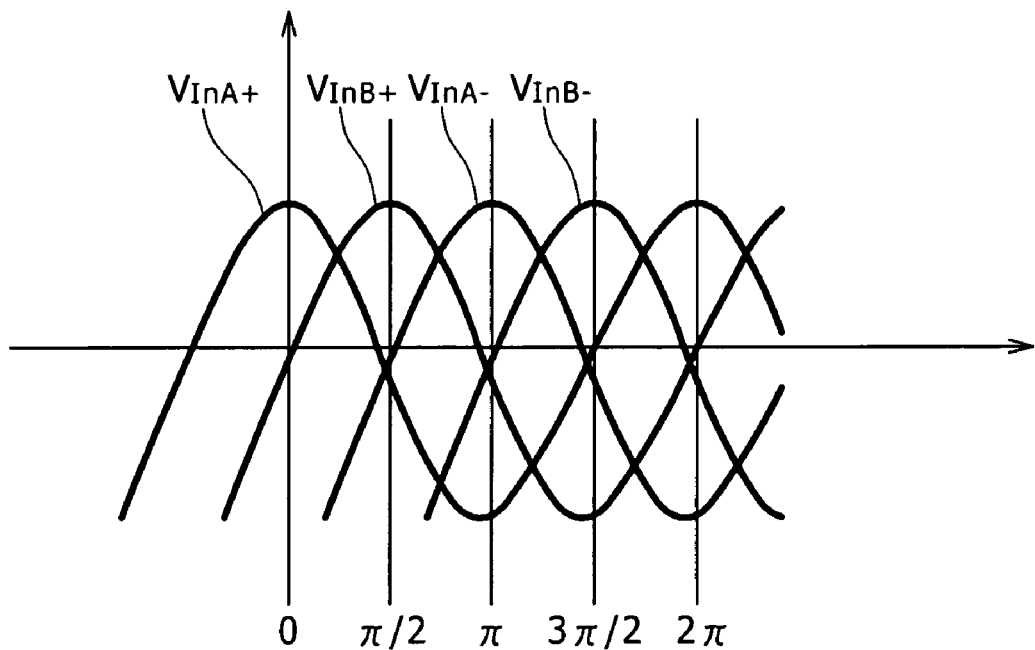
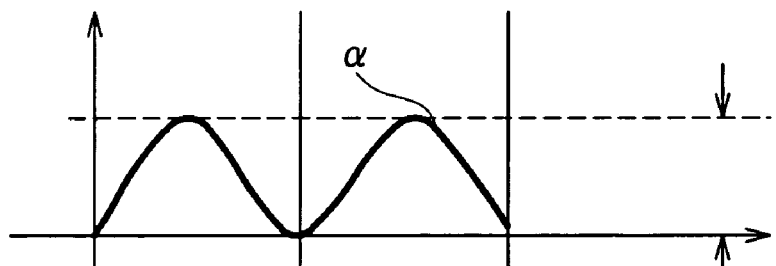
FIG.4A
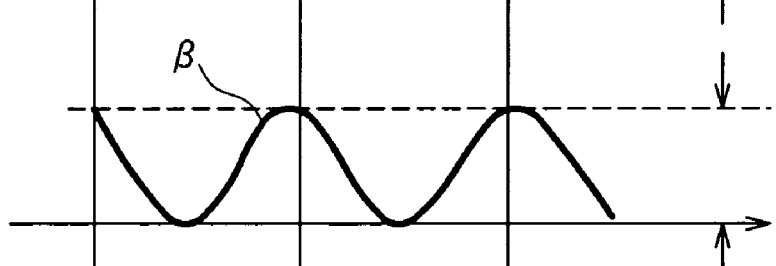
FIG.4B
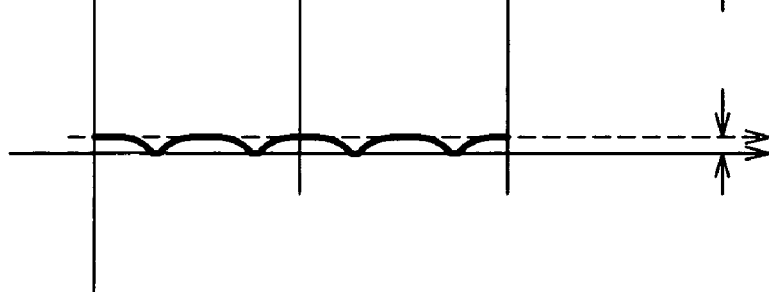
FIG.4C

US 7,394,325 B2

VOLTAGE-CONTROLLED OSCILLATOR CIRCUIT AND PLL CIRCUIT

CROSS REFERENCES TO RELATED APPLICATIONS

The present invention contains subject matter related to Japanese Patent Application JP 2005-202913 filed with the Japanese Patent Office on Jul. 12, 2005, the entire contents of which being incorporated herein by reference.

BACKGROUND OF THE INVENTION

1. Field of the Invention

The present invention relates to a voltage-controlled oscillator circuit and a PLL circuit, and particularly to a differential type voltage-controlled oscillator circuit and a PLL circuit including the same.

2. Description of the Related Art

In radio communications using portable telephones and the like, serial communications through various cables, systems for reproducing digitally recorded data from disk media (read channels), and the like, a PLL (Phase-Locked Loop) circuit is widely used to generate an oscillating signal with a high spectrum precision and generate a clock signal locked in frequency and phase to a data signal.

Recently, there has been a demand for increase in the speed of oscillating signals and clock signals, and there has been a desire for higher-performance PLL circuits.

One of indexes of performance called for of PLL circuits is the precision of an output signal. The precision of the output signal is decreased by thermal noise and various noises inherent in elements. Therefore suppression of this decrease is desired. As an index for evaluating this precision, indexes referred to as jitter performance and phase noise are widely used.

Main factors in jitter and phase noise include noise of a voltage-controlled oscillator (VCO) provided within a PLL circuit. The jitter performance of the PLL circuit can be improved by reducing the noise itself of the VCO.

VCOs are generally classified roughly into two types, that is, LCVCOs and ring VCOs according to the structures of the VOCs. LCVCOs generally have superior jitter performance. However, ring VCOs are widely used in applications where a jitter performance requirement is not so severe because of advantages of the ring VCO having a wide variable frequency range, being able to output a plurality of output signals different from each other in phase, and requiring no inductor, for example. Therefore improvement of the jitter performance of the ring VCO is desired to extend applications of the ring VCO.

Accordingly, description in the following will be made focusing on a differential type ring VCO.

FIG. 11 is a schematic diagram showing a differential type ring VCO in related art.

The ring VCO 90 includes a cascade connection of same VCO cells C91, C92, . . . , C9(n−1), and C9n in N stages (N VCO cells). When the number N of stages is an even number, the ring VCO 90 also includes an inverting unit for inverting differential signal lines. This inverting unit is unnecessary when the number N of stages is an odd number.

The oscillation frequency (hereinafter $f_0$) of the ring VCO is expressed by a delay time $T_D$ of the VCO cells and the number N of stages of the VCO cells as in Equation (1).

$$f_0 = 1/2N \cdot T_D \qquad (1)$$

The output differential signals of adjacent VCO cells have a phase difference of $\pi/N$ [rad] when N is an even number, and have a phase difference of $2\pi/N$ [rad] when N is an odd number.

The internal configuration of each VCO cell will next be described. However, since the internal configurations of the VCO cells C91, C92, . . . , C9(n−1), and C9n are similar to each other, the VCO cell C91 will be described as a representative.

FIG. 12 is a circuit diagram showing an equivalent circuit of the VCO cell shown in FIG. 11.

The VCO cell C91 includes loads R91 and R92, NMOS transistors M91 and M92, and a constant-current source I.

The NMOS transistors M91 and M92 form a differential pair (source-coupled pair). The drain of the NMOS transistor M91 is connected with the load R91. The drain of the NMOS transistor M92 is connected with the load R92. The gate of the NMOS transistor M91 is connected with an input terminal In+ to which a signal $V_+$ is input. The gate of the NMOS transistor M92 is connected with an input terminal In− to which a signal $V_-$ is input.

An output terminal Out− is connected between the drain of the NMOS transistor M91 and the load R91. An output terminal Out+ is connected between the drain of the NMOS transistor M92 and the load R92.

The opposite sides of the loads R91 and R92 from the NMOS transistor M91 and the NMOS transistor M92 are each connected to a voltage source VDD.

The sources of the NMOS transistor M91 and the NMOS transistor M92 are connected to the constant-current source I for outputting a constant current $I_{tail90}$ via a tail node (node) N90.

The NMOS transistors M91 and M92 generally have non-linear characteristics. For example, the characteristics of an ideal NMOS transistor conform to a square equation expressed by Equation (2).

$$I_{DS} = K \cdot (V_{GS} - V_T) \qquad (2)$$

where $I_{DS}$ is a drain-to-source current of the NMOS transistor, K is a constant determined by the size of the NMOS transistor, $V_{GS}$ is a gate-to-source voltage, and $V_T$ is a threshold voltage. A common signal $V_C$ and an oscillating signal $V_D$ obtained by converting a signal $V_+$ and a signal $V_-$ as a positive differential input signal and a negative differential input signal into a common component and a differential component are expressed by Equation (3).

$$V_C = \frac{V_+ + V_-}{2},\ V_D = \frac{V_+ V_-}{2} \qquad (3)$$

The voltage $V_{tail90}$ of the tail node N90 satisfies a relation of Equation (4) obtained from Equation (2) and Equation (3).

$$V_{tail90} = V_C - V_T - \sqrt{\frac{I_{tail90}}{2K} - V_D^2} \qquad (4)$$

As is understood from Equation (4), the voltage $V_{tail90}$ vibrates at a frequency twice that of the differential oscillating signal $V_D$, that is, a frequency $2f_0$. Incidentally, the vibration of the voltage $V_{tail90}$ at the frequency $2f_0$ will hereinafter be referred to as the "$2f_0$ vibration of the voltage $V_{tail}$". This is qualitatively understood as follows. When the differential signal $V_{D90}$ ($V_D$) vibrating in a sinusoidal manner becomes large while the common signal $V_{C90}$ ($V_C$) of the NMOS transistors M91 and M92 is fixed, the gate voltage of the NMOS transistor M91 increases, and the gate voltage of the NMOS transistor M92 decreases by an amount corresponding to the increase. However, because of the square characteristics of the NMOS transistors, a certain amount of increase in the gate-to-source voltages $V_{GS90}$ ($V_{GS}$) of the NMOS transistors M91 and M92 cause a greater current change than the same amount of decrease.

FIG. 13 is a graph showing the $2f_0$ vibration of the voltage at the tail node.

An overall current value is fixed at a constant value by the current source, and consequently an amount of change in the NMOS transistors M91 and M92 is adjusted by increase in the voltage $V_{tail90}$. The same is true for a case where the gate voltage of the NMOS transistor M92 increases. Hence, the voltage $V_{tail90}$ vibrates at a frequency twice the oscillation frequency.

However, the square characteristic of the NMOS transistor in a triode region (non-saturation region) in which a drain-to-source voltage $V_{DS}$ is lower than a voltage ($V_{GS}-V_T$) is expressed by Equation (5).

$$I_{DS}=K\cdot\{2\cdot(V_{GS}-V_T)^2\cdot V_{DS}-V_{DS}^2\} \quad (5)$$

An amplification factor gm of the NMOS transistor decreases in the triode region. That is, the gradient of an output waveform becomes gentle.

FIG. 14 is a graph showing the output waveform resulting from the $2f_0$ vibration of the voltage at the tail node.

The above-described $2f_0$ vibration of the voltage $V_{tail}$ distorts the output signal of the VCO cell C91. Specifically, as shown in FIG. 13, the voltage $V_{tail}$ becomes highest when the signal $V_+$ or the signal $V_-$ is smallest, the NMOS transistors M91 and M92 alternately enter the triode region, and the amplification factor gm, that is, the gradient of the output waveform is decreased. As a result, a frequency $2f_0$ component and other distortion components occur in the output signal of the VCO cell C91. Hence, a phase noise as a ratio between signal strength at a frequency $f_0$ and signal strength at a frequency adjacent to the frequency $f_0$ deteriorates. In addition, a component of the vibration of the frequency $2f_0$ causes harmonic distortion. Also, the amplitude of the output waveform is decreased.

It is known that a distorted oscillation waveform degrades the phase noise and jitter performance of the VCO due to the following causes (1) and (2) (see Non-Patent Document 1, for example).

(1) Due to a decrease in the peak-to-peak voltage of the output waveform, even when an amount of noise of a noise source is fixed, an amount of conversion of the noise source to phase noise increases.

(2) Due to asymmetry of the output waveform, an amount of conversion of various noise sources to phase noise increases, and in particular, effects of flicker (1/f) noise significantly increase.

In related art, it is known that the vibration of the voltage $V_{tail}$ makes oscillating operation unstable (see Patent Document 1).

FIG. 15 is a block diagram showing the configuration of another ring VCO in the past.

Incidentally, the same reference numerals are used to denote the same parts as in the ring VCO 90, and description thereof will be omitted.

In the ring VCO 91, an NMOS transistor is connected between each of tail nodes of VCO cells C91, C92, . . . , C9(n-1), and C9n and a ground (GND) terminal, and a replica cell Cr that has the same structure as the VCO cells C91, C92, . . . , C9(n-1), and C9n but is not supplied with signals is provided. Voltages at the tail nodes of all the VCO cells are controlled by an operational amplifier (not shown) so as to be equal to a reference tail node voltage of the replica cell.

[Patent Document 1]
Japanese Patent Laid-open No. 2001-326560
[Non-Patent Document 1]
"A general theory of phase noise in electrical oscillators," IEEE J. Solid-State Circuits, vol. 33, pp. 179-194, February 1998

SUMMARY OF THE INVENTION

However, this method has a problem of increases in circuit scale and power consumption because separate circuits such as the replica cell, the operational amplifier and the like are added. In addition, the addition of the separate circuits increases noise sources, and limits improvements of jitter performance.

The present invention has been made in view of the above. It is accordingly desirable to provide a voltage-controlled oscillator and a PLL circuit that suppress distortion of an oscillation waveform of a ring VCO and improve phase noise and jitter performance with a simple constitution.

According to an embodiment of the present invention, there is provided a differential type voltage-controlled oscillator circuit including a plurality of VCO cells, the switching elements, the switching elements, the plurality of VCO cells, and vibration canceling section. The plurality of VCO cells each has one pair of switching elements. The switching elements have one terminal side connected to a voltage source via a load and another terminal side connected to a common current source via a common node. The switching elements are supplied with differential signals. The plurality of VCO cells output differential signals different in phase from the differential signals. The vibration canceling section connects the plurality of VCO cells such that vibration at each node is cancelled.

Such an oscillator circuit cancels out the vibrations of the nodes of the VCO cells by the vibration canceling section. It is thereby possible to suppress and reduce distortion of the differential signals output from the VCO cells, and phase noise and jitter.

According to the present invention, the vibration at each node is suppressed and reduced by canceling out the vibrations of the nodes of the VCO cells by the vibration canceling section. It is thereby possible to easily and reliably prevent unnecessary vibration or distortion caused by operation of the switching elements in a triode region. Thus, it is possible to reduce distortion of an oscillation waveform, and improve phase noise and jitter performance.

The above-described effects are exerted more remarkably especially when an even number of VCO cells are used.

In addition, as compared with the circuits in related art, no significant change is made to the structure of the VCO cells and the like, and circuit scale and power consumption are not increased. Therefore the structure can be simplified.

BRIEF DESCRIPTION OF THE DRAWINGS

FIG. 3 is a diagram showing input waveforms in the equivalent circuit shown in FIG. 2;

FIGS. 4A and 4B are diagrams of assistance in explaining voltage at a tail node which voltage is generated as a result of input of differential signals, and FIG. 4C is a diagram showing the waveform of voltage at the tail node of the equivalent circuit;

FIG. 15 is a block diagram showing the configuration of another ring VCO in the past.

DETAILED DESCRIPTION OF THE PREFERRED EMBODIMENTS

Preferred embodiments of the present invention will hereinafter be described in detail with reference to the drawings.

Figure 1:
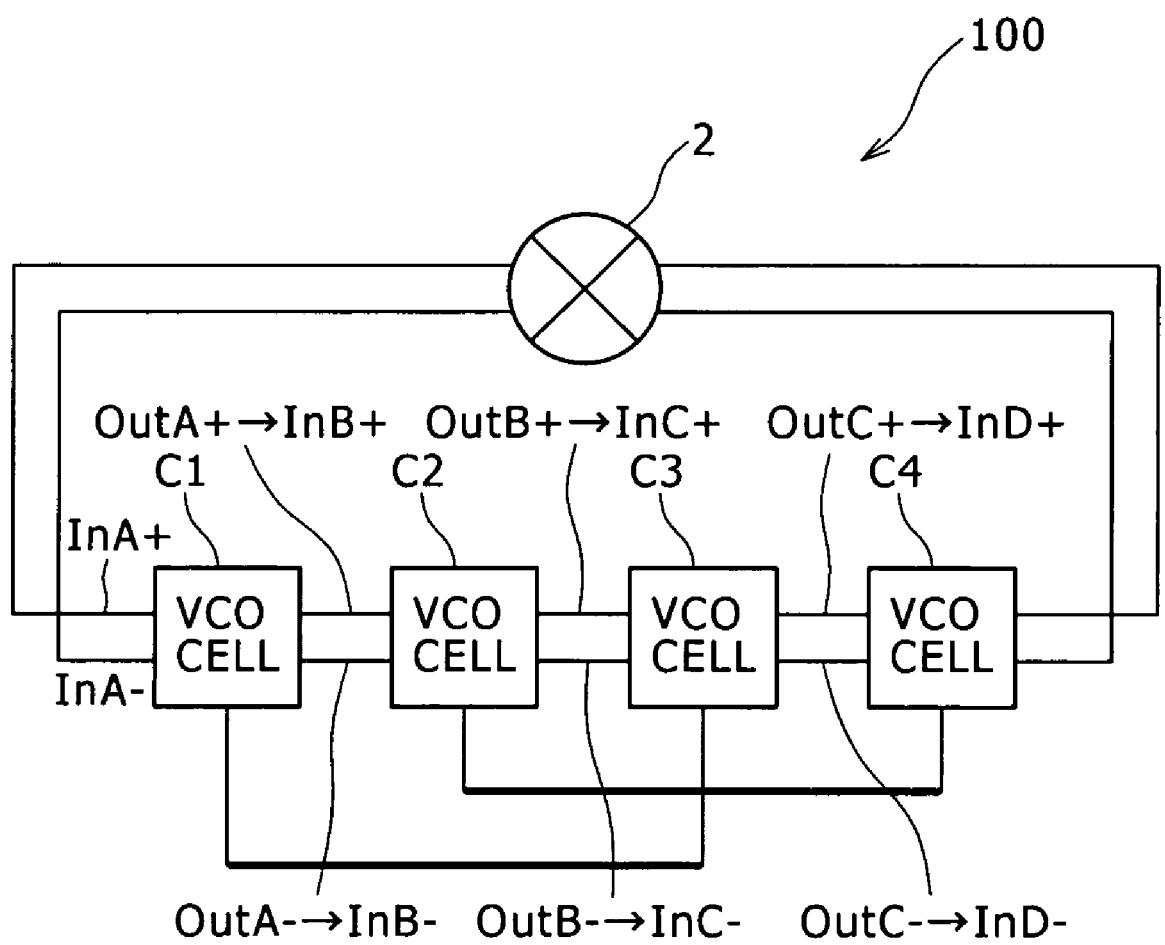
FIG. 1 is a block diagram of assistance in explaining an oscillator circuit according to a first embodiment.

FIG. 1 is a block diagram of assistance in explaining an oscillator circuit according to a first embodiment.

An oscillator circuit 100 is a voltage-controlled oscillator (VCO). The oscillator circuit 100 changes the frequency of an oscillating signal according to a control voltage signal corresponding to a phase difference between a reference signal and a feedback signal.

The oscillator circuit 100 includes four VCO cells C1 to C4 having a same internal configuration, and an inverting unit 2 for inverting differential signal lines connected to the VCO cell C1 and the VCO cell C4.

The tail nodes (to be described later) of the VCO cell C1 and the VCO cell C3 are connected to each other. The tail nodes of the VCO cell C2 and the VCO cell C4 are connected to each other.

The VCO cells C1 to C4 are cascaded in a plurality of stages in the form of a ring. The output terminals of the VCO cell C1 are connected to the input terminals of the VCO cell C2. The output terminals of the VCO cell C2 are connected to the input terminals of the VCO cell C3. The output terminals of the VCO cell C3 are connected to the input terminals of the VCO cell C4. The output terminals of the VCO cell C4 are connected to the input terminals of the VCO cell C1 via the inverting unit 2.

The VCO cells C1 to C4 output, from the output terminals, differential signals having a phase difference of π/4 [rad] with respect to differential signals input from the input terminals. That is, the VCO cells C1 to C4 are supplied with respective differential signals shifted in phase by π/4 [rad].

An equivalent circuit of two VCO cells having tail nodes thereof connected to each other will next be described. Since an equivalent circuit of the VCO cells C1 and C3 and an equivalent circuit of the VCO cells C2 and C4 are similar to each other, the equivalent circuit of the VCO cells C1 and C3 will be described as a representative.

Figure 2:
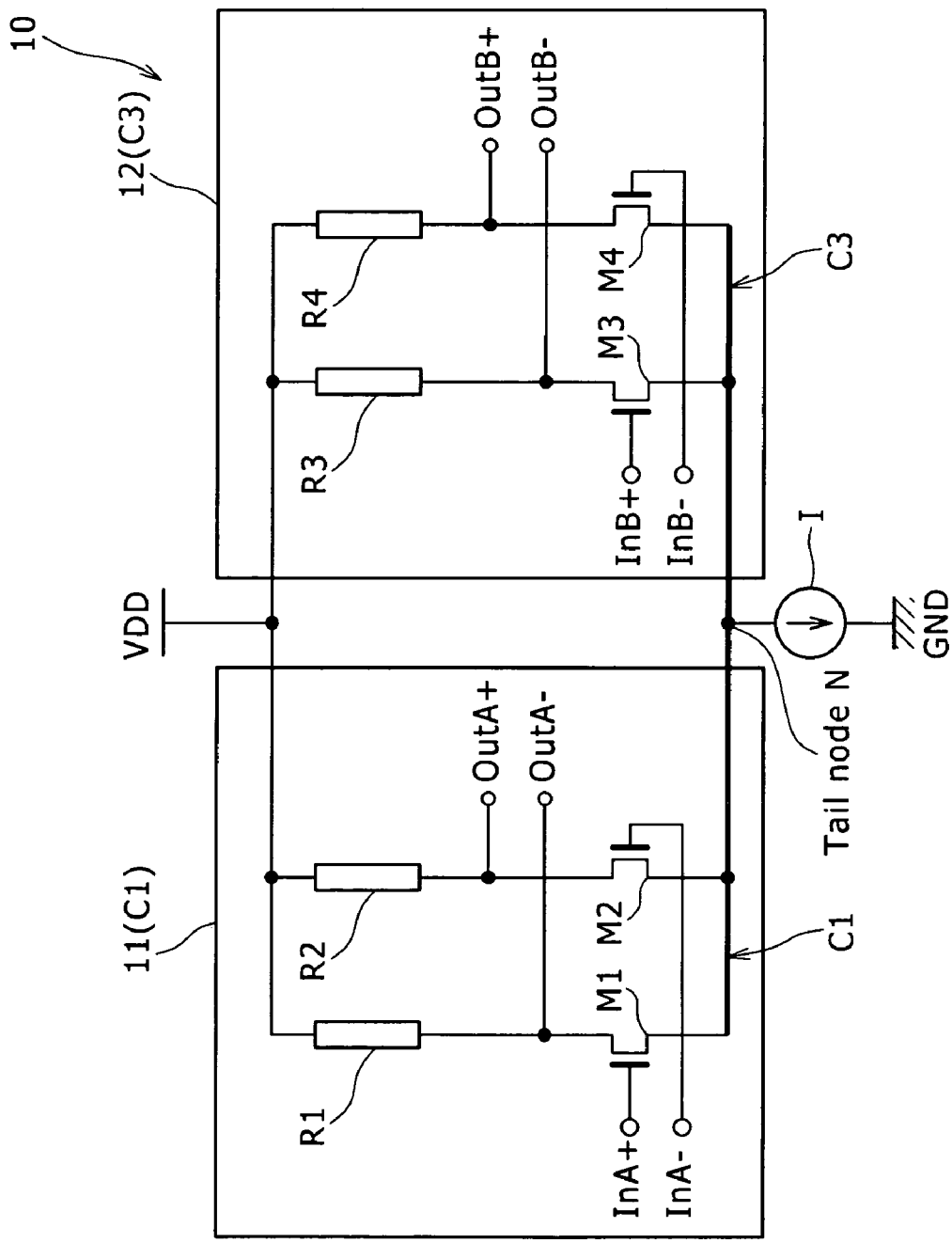
FIG. 2 is a circuit diagram showing an equivalent circuit of VCO cells whose tail nodes are connected to each other.

FIG. 2 is a circuit diagram showing the equivalent circuit of the VCO cells whose tail nodes are connected to each other.

The equivalent circuit 10 includes a differential amplifier unit 11 (VCO cell C1) formed by loads R1 and R2 and NMOS transistors M1 and M2, a differential amplifier unit 12 (VCO cell C3) formed by loads R3 and R4 and NMOS transistors M3 and M4, sources of the NMOS transistors M1, M2, M3, and M4, and a constant-current source I for outputting a constant current.

A tail node N in FIG. 2 constitutes a connection part connecting the sources of the NMOS transistors M1, M2, M3, and M4 to the constant-current source I.

The NMOS transistors M1 and M2 form a differential pair (source-coupled pair), and the NMOS transistors M3 and M4 form a differential pair (source-coupled pair).

The drain of the NMOS transistor M1 is connected with the load R1. The drain of the NMOS transistor M2 is connected with the load R2. The drain of the NMOS transistor M3 is connected with the load R3. The drain of the NMOS transistor M4 is connected with the load R4.

The gate of the NMOS transistor M1 is connected with an input terminal InA+ to which a signal $V_{InA+}$ is input. The gate of the NMOS transistor M2 is connected with an input terminal InA− to which a signal $V_{InA-}$ is input. The gate of the NMOS transistor M3 is connected with an input terminal InB+ to which a signal $V_{InB+}$ is input. The gate of the NMOS transistor M4 is connected with an input terminal InB− to which a signal $V_{InB-}$ is input.

An output terminal OutA− is connected between the drain of the NMOS transistor M1 and the load R1. An output terminal OutA+ is connected between the drain of the NMOS transistor M2 and the load R2. A signal having a phase difference of π/4 [rad] with respect to the signal $V_{InA+}$ is output from the output terminal OutA+. A signal having a phase difference of π/4 [rad] with respect to the signal $V_{InA-}$ is output from the output terminal OutA−.

An output terminal OutB− is connected between the drain of the NMOS transistor M3 and the load R3. An output terminal OutB+ is connected between the drain of the NMOS transistor M4 and the load R4. A signal having a phase difference of π/4 [rad] with respect to the signal $V_{InB+}$ is output from the output terminal OutB+. A signal having a phase difference of π/4 [rad] with respect to the signal $V_{InB-}$ is output from the output terminal OutB−.

The opposite sides of the loads R1, R2, R3, and R4 from the NMOS transistors M1, M2, M3, and M4 are each connected to a voltage source VDD.

The constitutions of the loads R1 to R4 and the constant-current source I are not specifically limited.

FIG. 3 is a diagram showing input waveforms in the equivalent circuit shown in FIG. 2.

A phase difference between the signal $V_{InA+}$ and the signal $V_{InA-}$ and a phase difference between the signal $V_{InB+}$ and the signal $V_{InB-}$ are each π [rad]. A phase difference between the differential signals input to the VCO cells C1 and C3 is π/4×2=π/2, and therefore a phase difference between the signal $V_{InA+}$ and the signal $V_{InB+}$ is π/2 [rad]. Hence, phase differences between the signal $V_{InA+}$, the signal $V_{InB+}$, the signal $V_{InA-}$, and the signal $V_{InB-}$ in this order are each π/2 [rad].

Description will next be made of voltage at the tail node which voltage is generated as a result of input of the differential signals.

FIGS. 4A and 4B are diagrams of assistance in explaining the voltage at the tail node which voltage is generated as a result of input of the differential signals. FIG. 4C is a diagram showing the waveform of the voltage at the tail node of the equivalent circuit.

A distortion α shown in FIG. 4A represents a voltage waveform at the tail node which waveform occurs as a result of input of the signal $V_{InA+}$ and the signal $V_{InA-}$ to the differential amplifier unit 11, that is, a voltage waveform at the tail node in the VCO cell C1 alone. Similarly, a distortion β shown in FIG. 4B represents a voltage waveform at the tail node which waveform occurs as a result of input of the signal $V_{InB+}$ and the signal $V_{InB-}$ to the differential amplifier unit 12, that is, a voltage waveform at the tail node in the VCO cell C3 alone.

As shown in FIG. 4C, the distortion a and the distortion β cancel each other out at the tail node N of the equivalent circuit 10, resulting in a very small amplitude of vibration.

Incidentally, in FIG. 4C, the amplitude of the vibration is shown in an exaggerated manner in order to facilitate understanding.

Description will next be made of a QDC (Quadrature Delay Cell) having the equivalent circuit shown in FIG. 2 as one unit.

Figure 5:
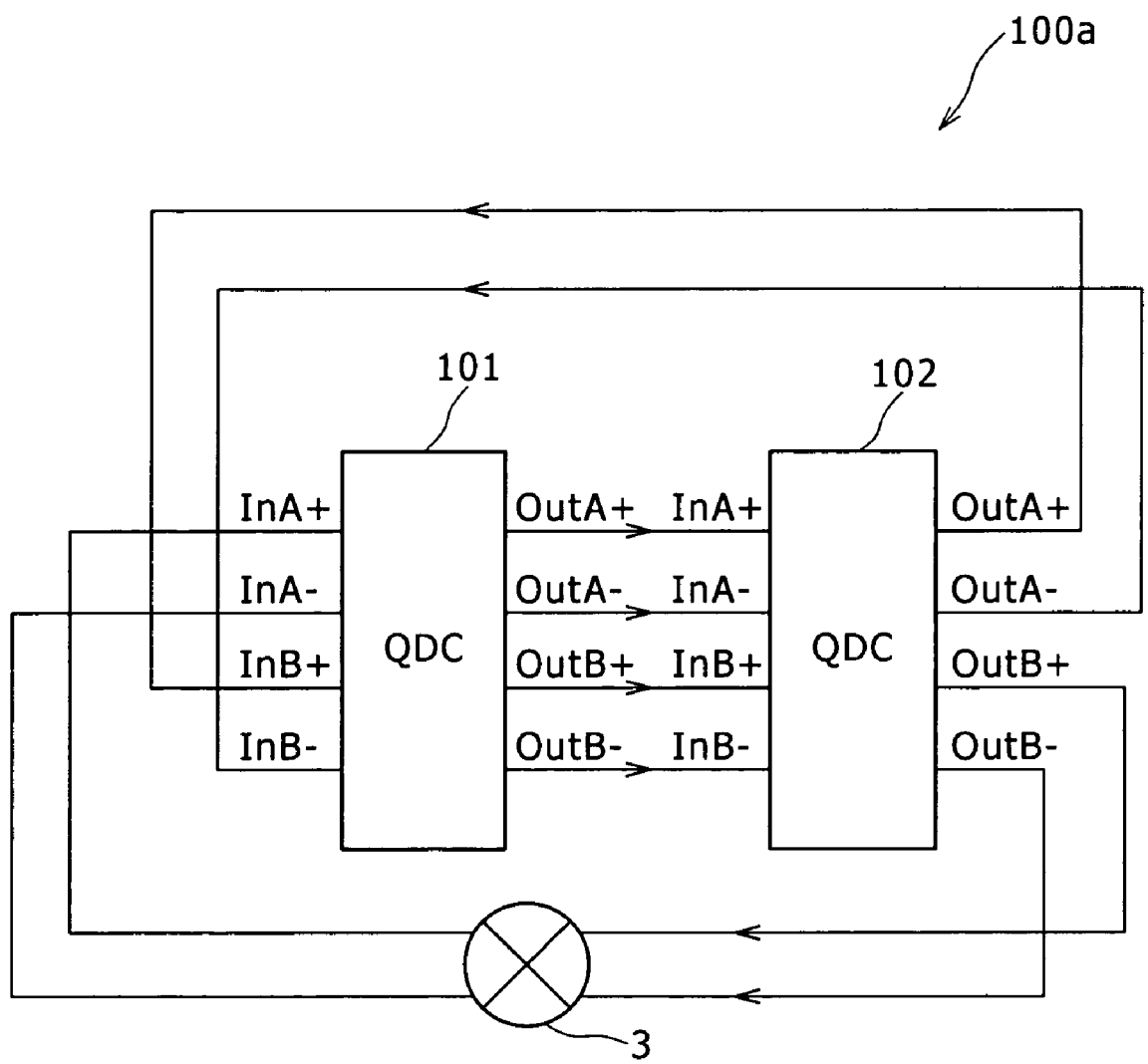
FIG. 5 is a block diagram showing an oscillator circuit according to the first embodiment using QDCs.

FIG. 5 is a block diagram showing an oscillator circuit according to the first embodiment using QDCs.

The oscillator circuit 100a includes a QDC 101 in which VCO cells C1 and C3 having tail nodes thereof connected to each other are formed as one unit (the QDC 101 has a similar configuration to that of the equivalent circuit 10), and a QDC 102 in which VCO cells C2 and C4 having tail nodes thereof connected to each other are formed as one unit (the QDC 102 has a similar configuration to that of the equivalent circuit 10).

The QDC 101 and the QDC 102 each have an input terminal InA+, an input terminal InA−, an input terminal InB+, an input terminal InB−, an output terminal OutA+, an output terminal OutA−, an output terminal OutB+, and an output terminal OutB−. The output terminal OutA+, the output terminal OutA−, the output terminal OutB+, and the output terminal OutB− of the QDC 101 are respectively connected to the input terminal InA+, the input terminal InA−, the input terminal InB+, and the input terminal InB− of the QDC 102. The output terminal OutA+, the output terminal OutA−, the output terminal OutB+, and the output terminal OutB− of the QDC 102 are respectively connected to the input terminal InA+, the input terminal InA−, the input terminal InB+, and the input terminal InB− of the QDC 101.

An inverting unit 3 for inverting differential signal lines is provided between the output terminal OutB+ and the output terminal OutB− of the QDC 102 and the input terminal InA+ and the input terminal InA− of the QDC 101.

The QDC 101 and the QDC 102 each output differential signals having a phase difference of π/4 [rad] with respect to differential signals input from the input terminal InA+, the input terminal InA−, the input terminal InB+, and the input terminal InB− from the output terminal OutA+, the output terminal OutA−, the output terminal OutB+, and the output terminal OutB−.

Such an oscillator circuit 100a provides similar effects to those of the oscillator circuit 100.

As described above, the oscillator circuit 100 and the oscillator circuit 100a according to the first embodiment can greatly reduce the vibration of the frequency $2f_0$ at the tail node N (suppress the vibration) by connecting the tail nodes of the VCO cell C1 and the VCO cell C3 to each other, the VCO cell C1 and the VCO cell C3 being supplied with differential signals with a phase difference of π/2 [rad]. It is thereby possible to easily and reliably prevent unnecessary vibration or distortion caused by operation of the NMOS transistors M1 to M4 in a triode region.

Hence, distortion of an output signal, especially harmonic distortion is reduced or suppressed, and deterioration in phase noise can be reliably prevented. As a result, jitter performance can be improved.

In addition, as compared with the circuits in related art, the oscillator circuit 100 and the oscillator circuit 100a are not significantly changed in terms of the structure of the VCO cells, and are not increased in terms of circuit scale and power consumption. Therefore the structure of the oscillator circuit 100 and the oscillator circuit 100a can be made simple.

A second embodiment of an oscillator circuit will next be described.

Description in the following will be made of oscillator circuits 100b and 100c according to the second embodiment, centering on differences from the foregoing first embodiment, and description of similar items will be omitted.

Figure 6:
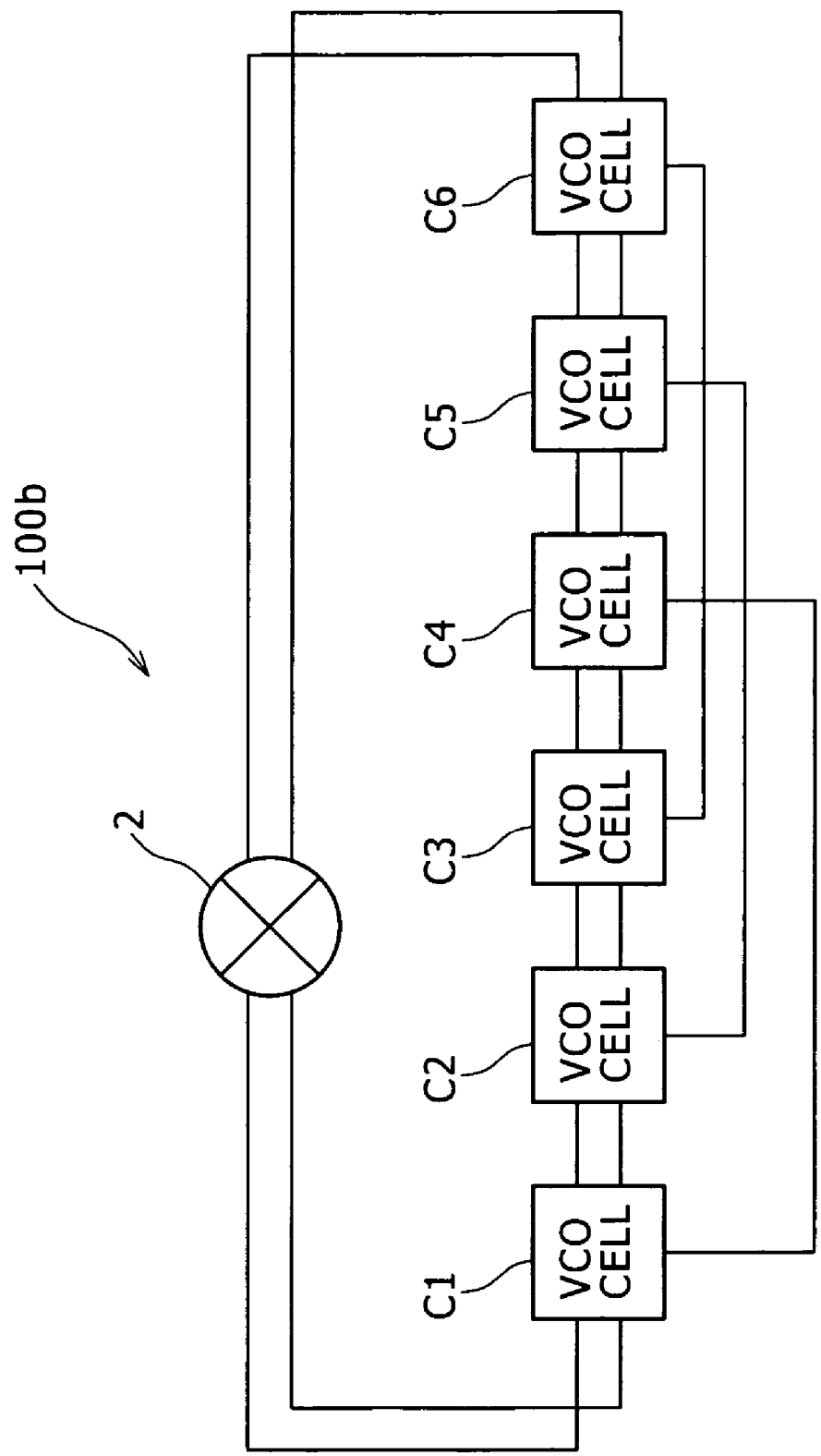
FIG. 6 is a block diagram showing an oscillator circuit according to a second embodiment.

FIG. 6 is a block diagram showing an oscillator circuit according to the second embodiment.

The oscillator circuit 100b according to the second embodiment is different from the oscillator circuit 100 according to the first embodiment in terms of combinations of VCO cells having tail nodes connected to each other.

The oscillator circuit 100b has VCO cells C1, C2, C3, C4, C5, and C6.

Letting N be the number of VCO cells (N is an even number of more than one), in the oscillator circuit 100b, the tail nodes of two VCO cells at an interval of N/2 stages are connected to each other. Specifically, the tail nodes of the VCO cell C1 and the VCO cell C4 are connected to each other; the tail nodes of the VCO cell C2 and the VCO cell C5 are connected to each other; and the tail nodes of the VCO cell C3 and the VCO cell C6 are connected to each other.

Figure 7:
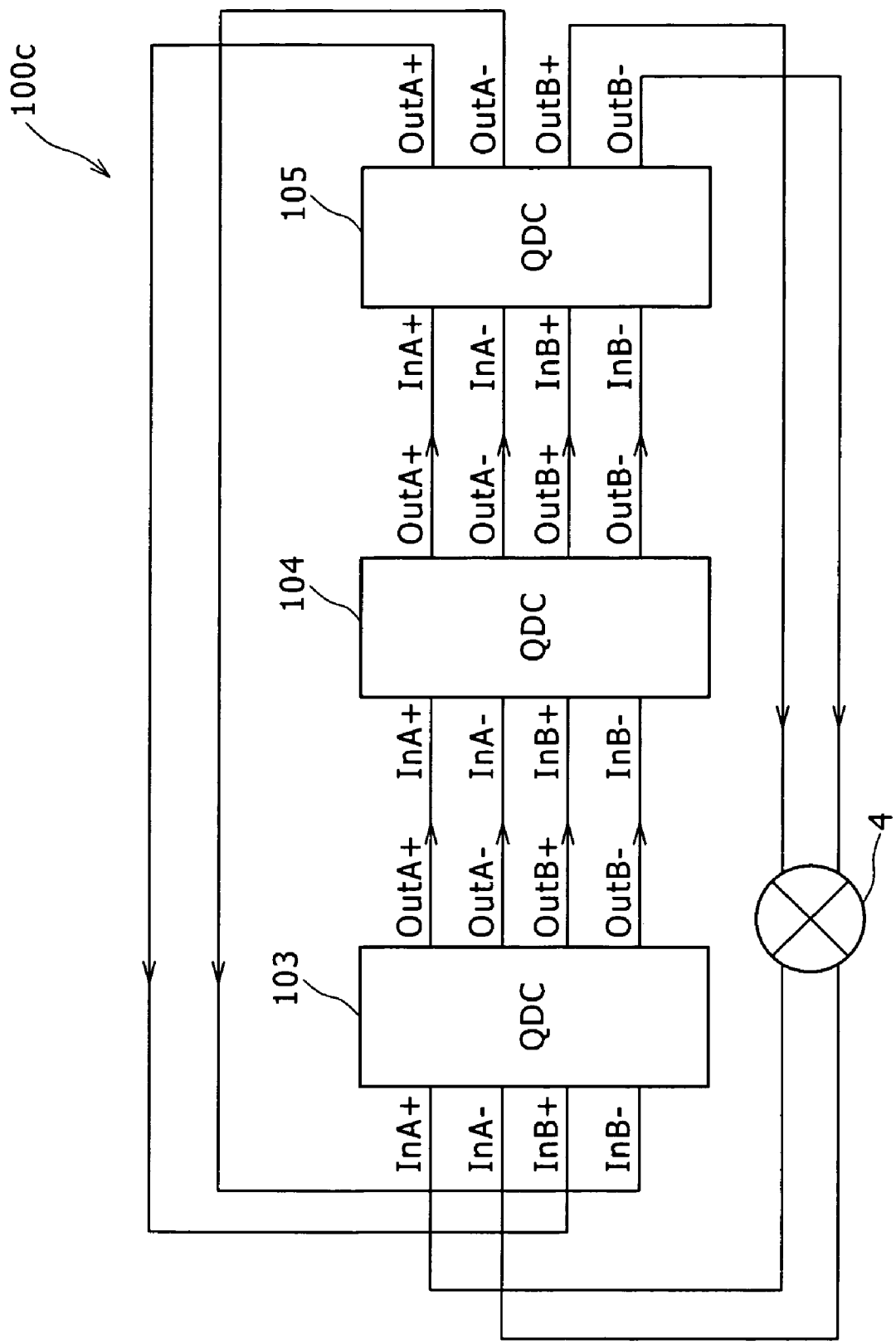
FIG. 7 is a circuit diagram showing an oscillator circuit according to the second embodiment using QDCs.

FIG. 7 is a circuit diagram showing an oscillator circuit according to the second embodiment using QDCs.

The oscillator circuit 100c includes a QDC 103 in which VCO cells C1 and C4 having tail nodes thereof connected to each other are formed as one unit (the QDC 103 has a similar configuration to that of the equivalent circuit 10), a QDC 104 in which VCO cells C2 and C5 having tail nodes thereof connected to each other are formed as one unit (the QDC 104 has a similar configuration to that of the equivalent circuit 10), and a QDC 105 in which VCO cells C3 and C6 having tail nodes thereof connected to each other are formed as one unit (the QDC 105 has a similar configuration to that of the equivalent circuit 10). An inverting unit 4 for inverting differential signal lines is provided between the output terminal OutB+ and the output terminal OutB− of the QDC 105 and the input terminal InA+ and the input terminal InA− of the QDC 103.

Such an oscillator circuit 100b and an oscillator circuit 100c provide similar effects to those of the oscillator circuit 100 and the oscillator circuit 100a according to the foregoing first embodiment.

As described in the explanations of the oscillator circuit 100a according to the first embodiment and the oscillator circuit 100b according to the second embodiment, when the number N of stages is an even number, VCO cells can be unitized easily by creating a QDC by connecting the tail nodes of two VCO cells at an interval of N/2 stages to each other and connecting input terminals corresponding to the output terminals of each QDC to the respective output terminals. In addition, the unitization for example simplifies a wiring pattern in the oscillator circuits.

A third embodiment of an oscillator circuit will next be described.

Description in the following will be made of an oscillator circuit 100d according to the third embodiment, centering on differences from the foregoing first embodiment, and description of similar items will be omitted.

Figure 8:
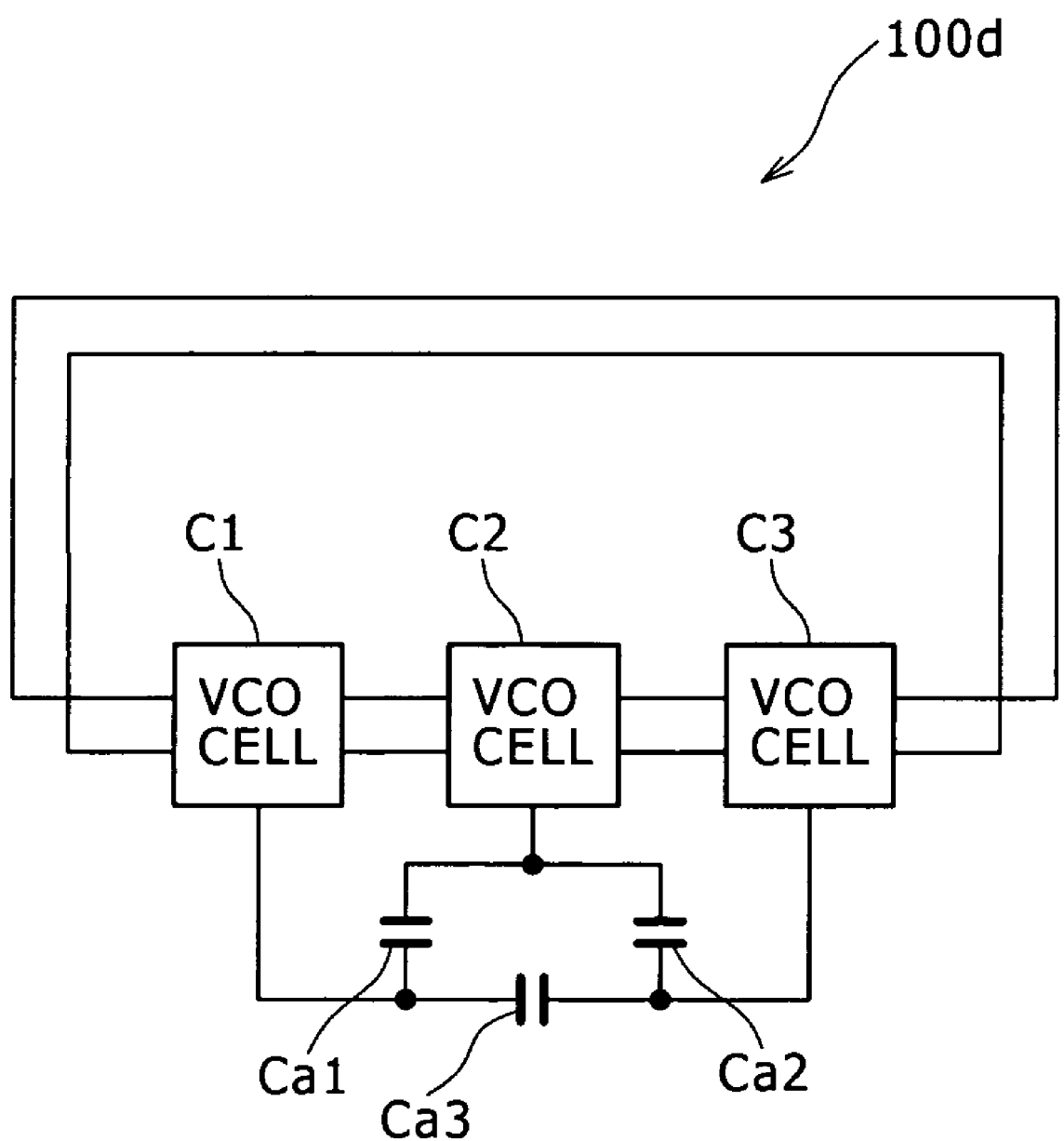
FIG. 8 is a block diagram showing an oscillator circuit according to a third embodiment.

FIG. 8 is a block diagram showing the oscillator circuit according to the third embodiment.

The oscillator circuit 100d according to the third embodiment is different from the oscillator circuit 100 according to the first embodiment and the oscillator circuit 100b according to the second embodiment in that the oscillator circuit 100d according to the third embodiment uses VCOs in an odd number of stages (an odd number of VCOs).

The oscillator circuit 100d includes: VCO cells C1, C2, and C3; a capacitance Ca1 disposed between the tail nodes of the VCO cells C1 and C2; a capacitance Ca2 disposed between the tail nodes of the VCO cells C2 and C3; and a capacitance Ca3 disposed between the tail nodes of the VCO cells C1 and C3. That is, the oscillator circuit 100d has a capacitance between the tail nodes of adjacent VCO cells.

The capacitances Ca1, Ca2, and Ca3 are provided so as not to affect a direct-current voltage component at the tail node of each cell. However, the capacitance Ca3 may be omitted.

Such an oscillator circuit 100d according to the third embodiment provides similar effects to those of the oscillator circuit 100 according to the first embodiment and the oscillator circuit 100b according to the second embodiment.

A fourth embodiment of an oscillator circuit will next be described.

Description in the following will be made of an oscillator circuit 100e according to the fourth embodiment, centering on differences from the foregoing third embodiment, and description of similar items will be omitted.

Figure 9:
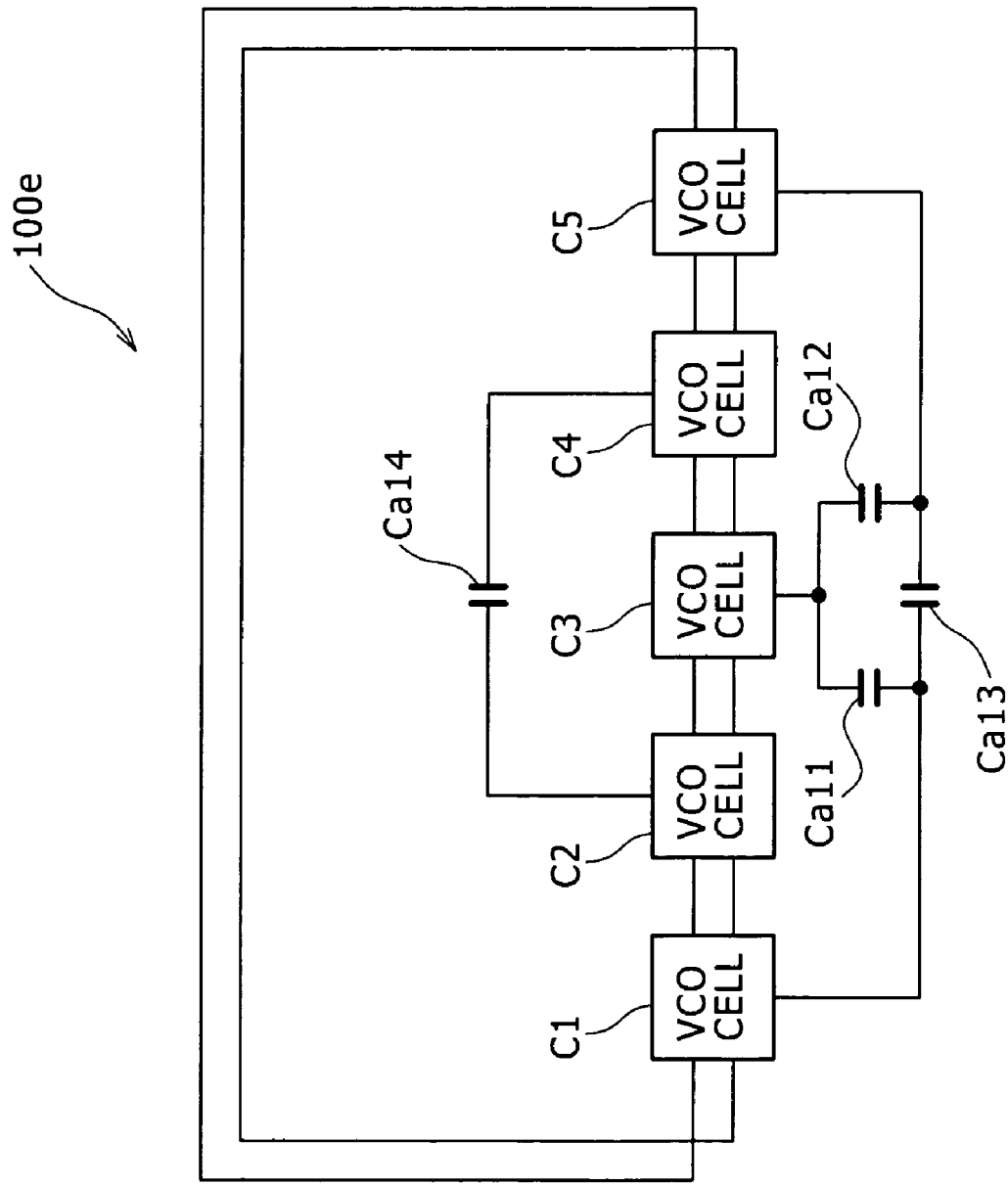
FIG. 9 is a block diagram showing an oscillator circuit according to a fourth embodiment.

FIG. 9 is a block diagram showing the oscillator circuit according to the fourth embodiment.

The oscillator circuit 100e according to the fourth embodiment is different from the oscillator circuit 100d according to the third embodiment in terms of combinations of VCO cells having tail nodes connected to each other.

The oscillator circuit 100e includes: VCO cells C1, C2, C3, C4 and C5; a capacitance Ca11 disposed between the tail nodes of the VCO cells C1 and C3; a capacitance Ca12 disposed between the tail nodes of the VCO cells C3 and C5; a capacitance Ca13 disposed between the tail nodes of the VCO cells C1 and C5; and a capacitance Ca14 disposed between the tail nodes of the VCO cells C2 and C4. However, the capacitance Ca13 may be omitted.

In the oscillator circuit 100e, the tail nodes of two VCO cells at an interval of (N−1)/2 stages are connected to each other. That is, the tail nodes of two VCO cells at an interval of two stages are connected to each other via a capacitance.

Such an oscillator circuit 100e according to the fourth embodiment provides similar effects to those of the oscillator circuit 100d according to the third embodiment.

As described in the explanations of the oscillator circuit 100d according to the third embodiment and the oscillator circuit 100e according to the fourth embodiment, of VCO cells of an arbitrary number of stages when the number N of stages is an odd number, the tail nodes of VCO cells at an interval of (N−1)/2 stages are connected to each other via a capacitance, whereby $2f_0$ vibrations at the tail nodes weaken each other, and thus output waveform distortion can be reduced.

While in the oscillator circuit 100d according to the third embodiment and the oscillator circuit 100e according to the fourth embodiment, the tail nodes of VCO cells at an interval of (N−1)/2 stages are connected to each other via a capacitance, the tail nodes of VCO cells at an interval of (N+1)/2 stages may be connected to each other via a capacitance. Which constitution to select is determined on the basis of details of components of each VCO cell.

The above-described oscillator circuits 100 to 100e can be suitably applied to PLL circuits. An example of application of the oscillator circuit 100 as a representative to a PLL circuit will be shown in the following.

Figure 10:
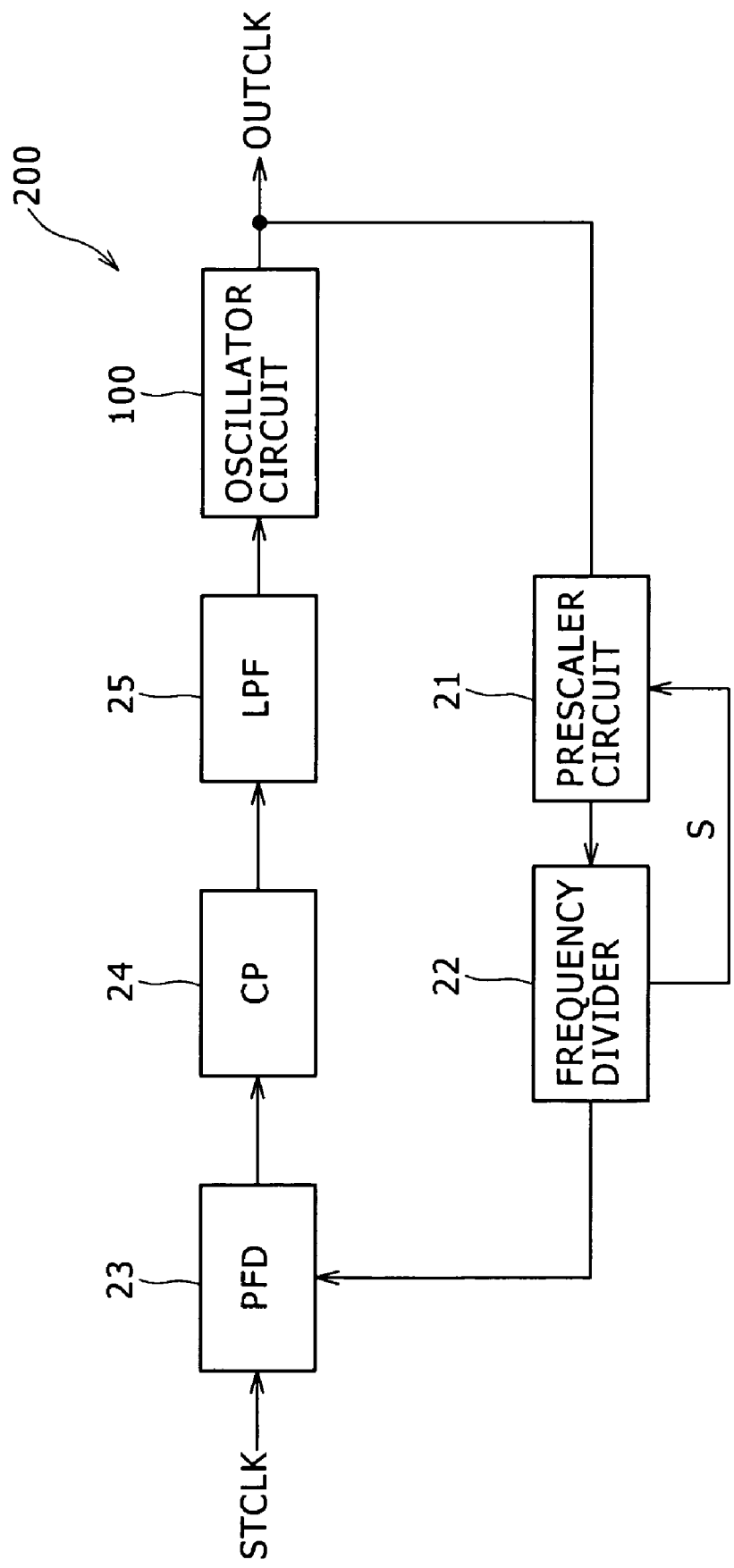
FIG. 10 is a block diagram showing an embodiment of a PLL circuit.
Figure 11:
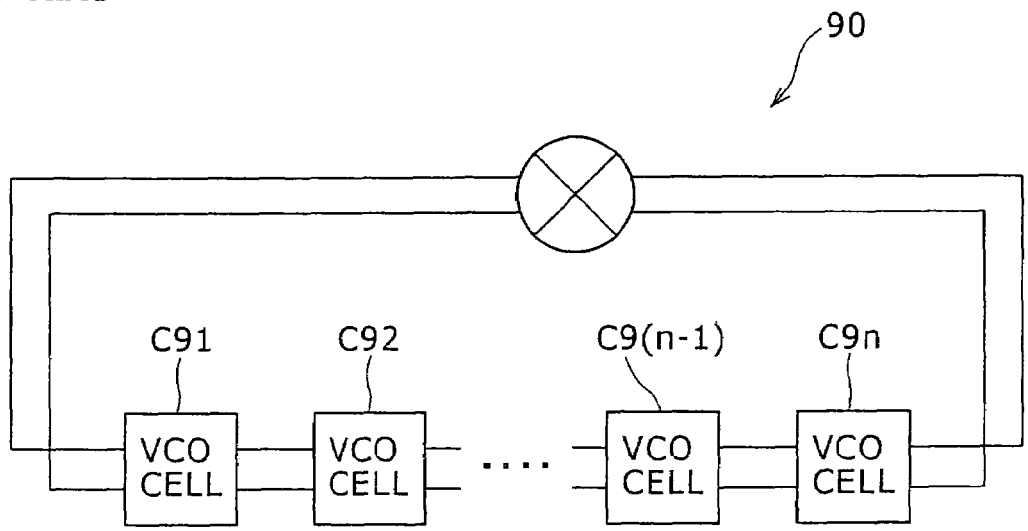
FIG. 11 is a schematic diagram showing a differential type ring VCO in the past.
Figure 12:
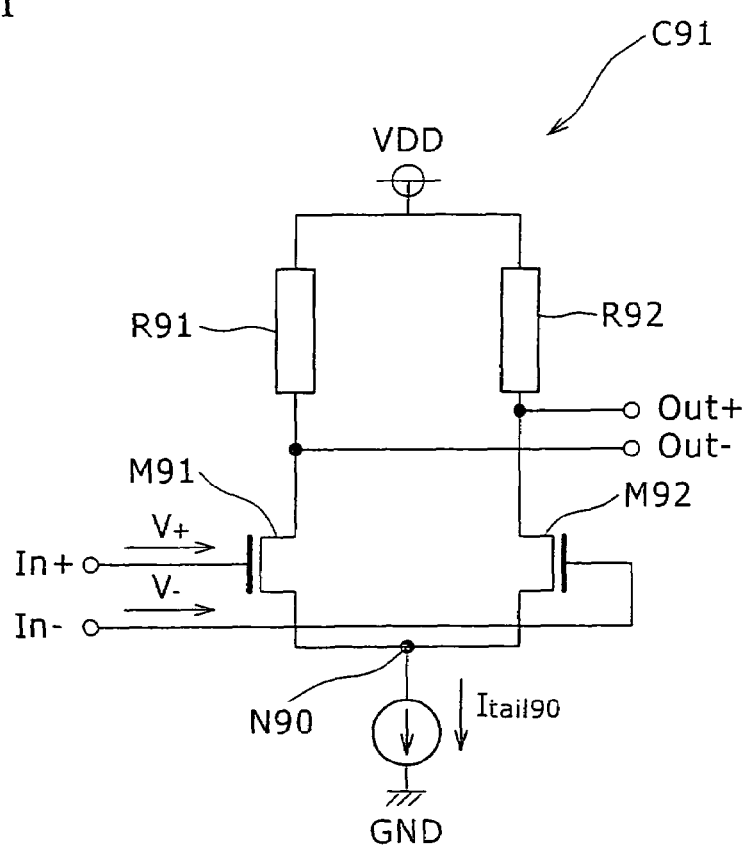
FIG. 12 is a circuit diagram showing an equivalent circuit of a VCO cell shown in FIG. 11.
Figure 13:
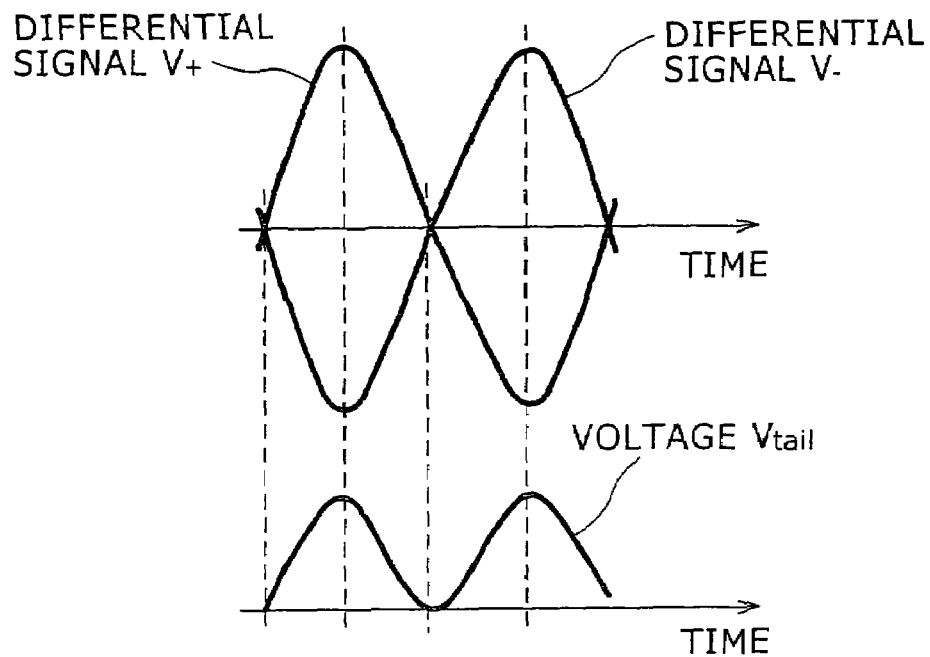
FIG. 13 is a graph showing $2f_0$ vibration of voltage at a tail node.
Figure 14:
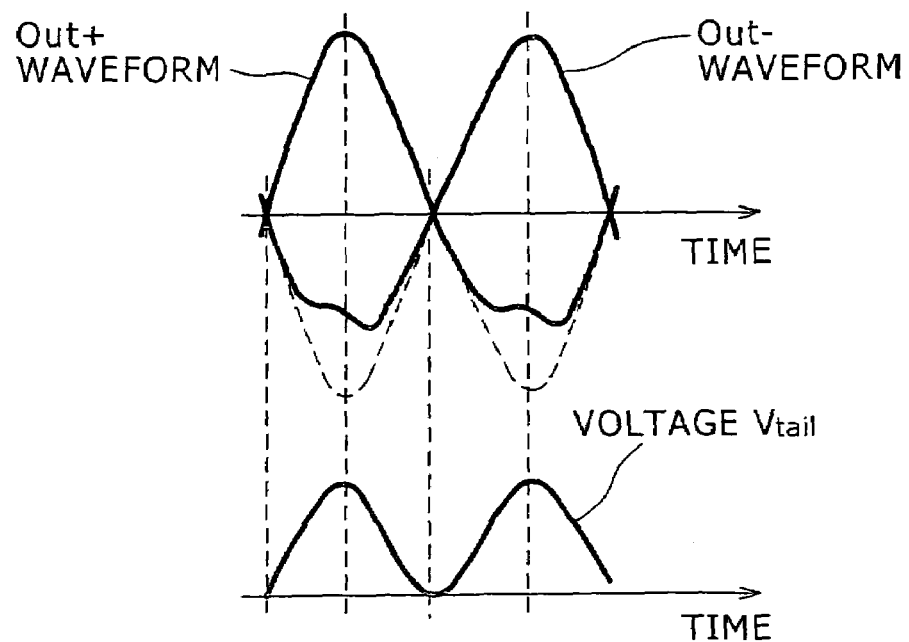
FIG. 14 is a graph showing an output waveform resulting from the $2f_0$ vibration of the voltage at the tail node.
Figure 1:
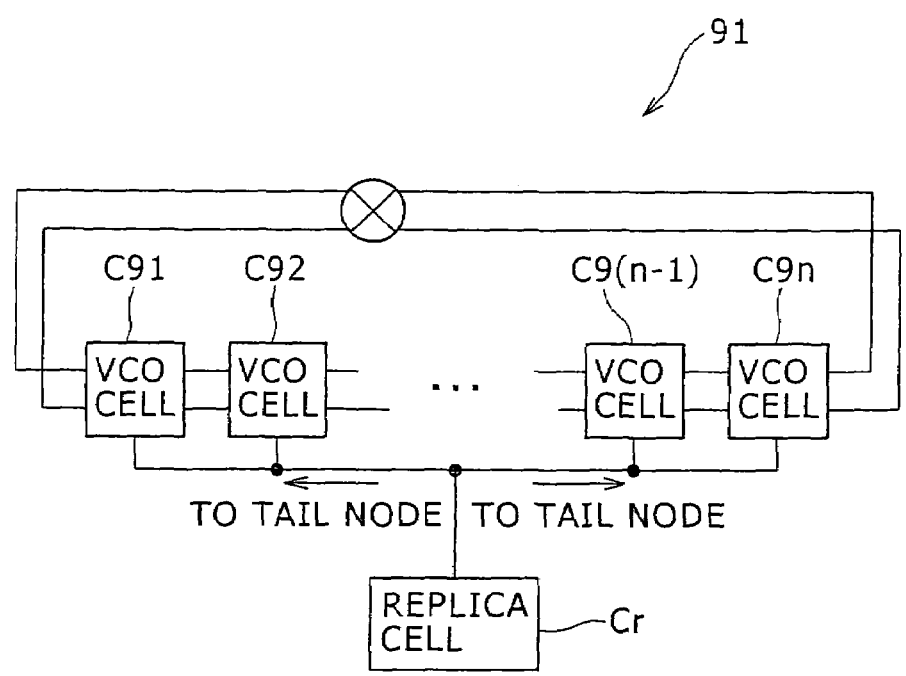

FIG. 10 is a block diagram showing an embodiment of a PLL circuit.

The PLL circuit 200 has a prescaler 21, a frequency divider 22, a phase frequency comparator (PFD: Phase Frequency Detector) 23, a charge pump (CP) 24, a loop filter (LPF) 25, and an oscillator circuit 100.

The prescaler 21 divides the frequency of an output clock OUTCLK output to the outside of the PLL circuit 200. The prescaler 21 can change a frequency dividing ratio according to a control signal S output from the frequency divider 22. The frequency divider 22 further divides the frequency of the output clock OUTCLK whose frequency has been divided by the prescaler 21.

The PFD 23 is supplied with a reference clock STCLK serving as a reference for the output clock OUTCLK and the clock whose frequency has been divided by the prescaler 21 and the frequency divider 22. The PFD 23 outputs a pulse signal having a width proportional to a difference between the phases of the reference clock STCLK and the clock whose frequency has been divided by the prescaler 21 and the frequency divider 22.

The CP 24 outputs a voltage or a current proportional to the width of the pulse signal output from the PFD 23.

The LPF 25 filters high frequencies of the voltage or the current output from the CP 24.

The oscillator circuit 100 outputs the output clock OUTCLK having a frequency corresponding to the value of the voltage or the value of the current output from the LPF 25.

That is, the PLL circuit 200 operates such that the frequency of the output clock OUTCLK which frequency has been divided by the prescaler 21 and the frequency divider 22 becomes equal to the frequency of the reference clock STCLK. The PLL circuit 200 thereby outputs the output-clock OUTCLK at a constant frequency.

By applying the oscillator circuit 100 (the oscillator circuits 100 to 100e) to the PLL circuit 200, it is possible to easily prevent an increase in the circuit scale of the PLL circuit 200 and an increase in power consumption. It is also possible to reduce distortion of the output waveform of the PLL circuit, and improve phase noise performance and jitter performance.

While preferred embodiments of the present invention have been described above in detail, the present invention is not limited to these particular embodiments. The constitution of each part may be replaced with an arbitrary constitution having a similar function. In addition, other arbitrary constitutions and processes may be added to the present invention.

Further, the present invention may be a combination of two or more arbitrary constitutions (features) of the foregoing embodiments.

It is to be noted that while in the foregoing embodiments, the NMOS transistors M1 to M4 are used as switching elements in VCO cells, the present invention is not limited to this, and arbitrary amplifying elements can be used.

In addition, while description in the foregoing embodiments has been made of a case where sinusoidal waves are input to the VCO cells C1 to C6 (QDCs 101 to 105), the present invention is not limited to this, and similar effects can be obtained when arbitrary waveforms such for example as rectangular waves are input.

It should be understood by those skilled in the art that various modifications, combinations, sub-combinations and alterations may occur depending on design requirements and other factors insofar as they are within the scope of the appended claims or the equivalents thereof.

What is claimed is:

1. A differential type voltage-controlled oscillator circuit comprising:
    a plurality of VCO cells each having one pair of switching elements;
    said switching elements having one terminal side connected to a voltage source via a load and another terminal side connected to a common current source via a common node;
    said switching elements being supplied with differential signals;
    said plurality of VCO cells outputting differential signals different in phase from said supplied differential signals; and
    vibration canceling means connecting said plurality of VCO cells such that vibration at each said node is cancelled, wherein
    said vibration canceling section has a connecting part connecting nodes of said VCO cells supplied with said differential signals shifted in phase by $\pi/2$ to each other.

2. The voltage-controlled oscillator circuit as claimed in claim 1, wherein said plurality of VCO cells are cascaded in a plurality of stages in a form of a ring.

3. The voltage-controlled oscillator circuit as claimed in claim 1, wherein said vibration canceling section has a connecting part connecting nodes of predetermined said VCO cells to each other.

4. The voltage-controlled oscillator circuit as claimed in claim 1, wherein said VCO cells having said nodes connected to each other are formed as one unit.

5. The voltage-controlled oscillator circuit as claimed in claim 1, wherein
    when a number of stages of said plurality of VCO cells is an even number, said vibration canceling section has a connecting part connecting nodes of said VCO cells at an interval of N/2 (N is the number of stages of said VCO cells) stages to each other.

6. The voltage-controlled oscillator circuit as claimed in claim 1, wherein
    when a number of stages of said plurality of VCO cells is an odd number, said vibration canceling section has a connecting part connecting each said node via a capacitor.

7. The voltage-controlled oscillator circuit as claimed in claim 6, wherein
    said vibration canceling section connects nodes of said VCO cells at an interval of (N−1)/2 stages (N is a number of stages of said VCO cells) or (N+1)/2 stages to each other.

8. A PLL circuit comprising:
    a differential type voltage-controlled oscillator circuit including a plurality of VCO cells each having one pair of switching elements;
    said switching elements having one terminal side connected to a voltage source via a load and another terminal side connected to a common current source via a common node;
    said switching elements being supplied with differential signals;
    said plurality of VCO cells outputting differential signals different in phase from said supplied differential signals; and
    vibration canceling means connecting said plurality of VCO cells such that vibration at each said node is cancelled, wherein
    said vibration canceling section has a connecting part connecting nodes of said VCO cells supplied with said differential signals shifted in phase by $\pi/2$ to each other.

* * * * *